United States Patent [19]

Baker

[11] Patent Number: 4,510,399

[45] Date of Patent: Apr. 9, 1985

[54] DEMODULATOR CIRCUIT FOR PARALLEL AC POWER SYSTEMS

[75] Inventor: Donal E. Baker, Elida, Ohio

[73] Assignee: Westinghouse Electric Corp., Pittsburgh, Pa.

[21] Appl. No.: 433,325

[22] Filed: Oct. 7, 1982

[51] Int. Cl.³ .............................................. H02V 3/16
[52] U.S. Cl. .................................... 307/57; 363/164; 363/165
[58] Field of Search .................... 307/73, 57, 58, 264, 307/271, 296 A, 522; 323/269, 270, 271, 283; 363/132, 163, 164

[56] References Cited

U.S. PATENT DOCUMENTS

| | | | |
|---|---|---|---|
| 3,294,976 | 12/1966 | Tipton et al. | 307/57 |
| 3,714,593 | 1/1973 | Kime et al. | 329/50 |
| 3,748,493 | 7/1973 | Billings et al. | 307/232 |
| 3,879,670 | 3/1975 | Fox | 329/50 |
| 4,061,882 | 12/1977 | Dorren | 179/15 BT |
| 4,319,319 | 3/1982 | Fauer et al. | 363/132 X |

Primary Examiner—A. D. Pellinen
Assistant Examiner—Todd E. DeBoer
Attorney, Agent, or Firm—R. P. Lenart

[57] ABSTRACT

A demodulator circuit utilizes a switching demodulation technique to detect the real and reactive components of load current unbalance in a parallel source alternating current power system. A signal representing load current unbalance is selectively switched to a pair of output terminals in response to a series of pulse wave control signals which bear a phase relationship with the Thevenin equivalent voltage of one of the power sources such that the signal appearing at one of the output terminals represents the real load current component while the signal at the other output terminal represents the reactive load current component. The signals at these terminals are fed back to control the frequency and voltage magnitude of one of the power system sources to eliminate load current unbalance.

22 Claims, 3 Drawing Figures

DEMODULATOR CIRCUIT FOR PARALLEL AC POWER SYSTEMS

BACKGROUND OF THE INVENTION

The present invention relates to the detection of unbalanced load current in alternating current power systems having a plurality of power sources operating in parallel and more particularly to a circuit for demodulating the real and reactive components of unbalanced load current.

AC electric power systems are usually connected in parallel to increase total system rating or in certain cases such as airborne power systems, to increase reliability. In order to further improve reliability and to maximize efficiency, it is generally desired that the total system load be divided equally among the paralleled generators. Load division among AC generators is accomplished by controlling, in a closed loop manner, individual generator voltages and phase angles. The exact method of control is dependent upon the impedances between the paralleled generator Thevenin voltages. For example, if the impedance between sources is primarily resistive, then a difference in Thevenin voltage magnitude will create an unbalance in real source power and a phase angle unbalance will create an unbalance in reactive source power. This impedance between sources must include the source or Thevenin impedance, the feeder bus impedance and parallel tie bus impedances.

In most AC power systems, the impedance between sources is primarily inductive. For this condition, voltage unbalance will create an unbalanced reactive source power and phase angle errors will cause an unbalance in real source power. However, exactly balanced Thevenin voltages and phase angles will not insure equal load division for all conditions. For example, a parallel tie bus with nonzero impedance which has unsymmetrically located load taps can cause an unbalance in impedance between sources and the load tap point. This can result in unbalanced source currents. Other variables such as manufacturing tolerances on the Thevenin source impedance can cause excessive current unbalance in a parallel system with otherwise matched voltage and phase angles. In a variable speed constant frequency (VSCF) aircraft power system, the source power is generated through an electronic power converter or inverter. These systems can be easily and accurately synchronized in phase with a common reference input signal. However, for the reasons mentioned above, this is not sufficient to eliminate the need for a real load division control loop. Since the VSCF source impedance is primarily inductive at fundamental frequency, the real load division loop must provide a means to alter the phase angle of the Thevenin voltages. Reactive load division is controlled through Thevenin voltage magnitude control.

Parallel alternating current systems including means for detecting unbalanced load current flow are disclosed in U.S. Pat. No. 3,294,976, issued Dec. 27, 1966 to L. L. Tipton, et al. and U.S. Pat. No. 3,748,493, issued July 24, 1973 to Billings, et al. These patents provide background information for the present invention and are hereby incorporated by reference. U.S. Pat. No. 3,879,670, issued Apr. 22, 1975 to Fox, discloses a synchronous demodulator circuit suitable for use as a detector to establish the amplitude and polarity of an unbalanced reactive load current in a parallel AC power system and is hereby incorporated by reference. The present invention performs the required demodulation in a manner similar to that disclosed in U.S. Pat. No. 3,879,670 with a substantially less complex circuit.

SUMMARY OF THE INVENTION

A demodulator circuit suitable for use as a detector of real and reactive load current components in a parallel alternating current power supply constructed in accordance with this invention comprises: a first input terminal for receiving a time varying electrical signal; a second input terminal for receiving a pulse wave control signal, wherein this pulse wave control signal is synchronized with the Thevenin voltage of an ac generator in the parallel power system; means for switching the time varying signal to a first output terminal when the pulse wave control signal is at a predetermined voltage level; a third input terminal for receiving a second pulse wave control signal being phased displaced from the first pulse wave control signal by 90°; and means for switching the time varying signal to a second output terminal when the second pulse wave control signal is at a predetermined voltage level. This demodulator can be used in accordance with this invention in a parallel power system comprising: the described demodulator, wherein the time varying electrical signal varies in response to unbalanced current flow in the system; at least two variable voltage, variable frequency power sources having outputs connected to a common bus; means for controlling the frequency of one of the power sources in response to the voltage on the first output terminal; and means for controlling the magnitude of the voltage of the same power source in response to the voltage on the second output terminal.

The demodulator of a parallel AC power system constructed in accordance with this invention demodulates a time varying electrical signal in accordance with a method comprising the steps of: generating a first pulse wave control signal which is in phase with the real component of the signal being demodulated; switching the signal being demodulated to a first output terminal when the first pulse wave control signal is at a predetermined voltage level; generating a second pulse wave control signal which is phase displaced from said first pulse wave control signal by 90°; and switching the signal being demodulated to a second output terminal when the second pulse wave control signal is at a predetermined voltage level. The use of this demodulator leads to a method for controlling a parallel source power system comprising the steps of: generating a time varying electrical signal proportional to unbalanced current flow in one phase of a power source in the power system; generating a first pulse wave control signal which is in phase with the real component of the time varying electrical signal; switching the time varying electrical signal to a first terminal when the first pulse wave control signal is at a predetermined voltage level; generating a second pulse wave control signal which is phase displaced from the first pulse wave control signal by 90°; switching the time varying electrical signal to a second terminal when the second pulse wave control signal is at a predetermined voltage level; controlling the frequency of the power source in response to the voltage on the first terminal; and controlling the magnitude of the output voltage of the power source in response to the voltage on the second terminal.

DESCRIPTION OF THE PREFERRED EMBODIMENT

Figure 1:
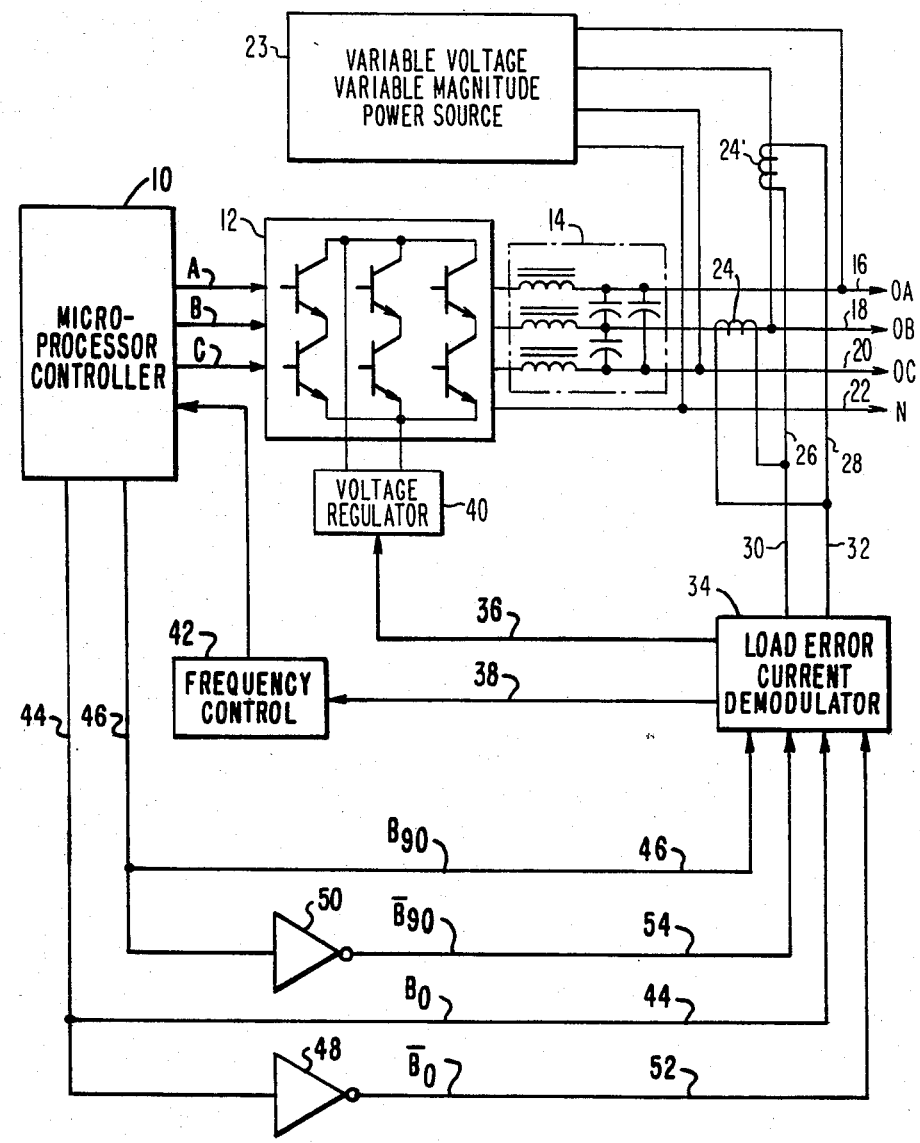
FIG. 1 is a block diagram of a parallel source AC power system including a demodulator circuit in accordance with the present invention.

Referring to the drawings, FIG. 1 is a block diagram of a parallel source AC power system constructed in accordance with one embodiment of the present invention. A microprocessor controller 10 produces a series of waveform patterns on data lines A, B and C which control the switching times of a plurality of power pole switches 12 in an inverter power source. The output of the inverter power pole switches 12 is fed through an inverter filter 14 to a parallel bus comprising conductors 16, 18, 20 and 22 which correspond to power system phases A, B and C and the neutral N respectively. A second variable voltage, variable magnitude power source 23 is shown to have an output which is electrically connected in parallel with the output of the inverter power source. A load current division transformer 24 senses current in one phase, for example phase B in this embodiment, and is connected in a series ring with other current transformers, for example transformer 24' in phase B of each channel of the system by way of conductors 26 and 28. This series connection of current transformers results in the generation of a time varying electrical signal on lines 30 and 32 which is representative of unbalanced load current flow in the respective channel. Load current demodulator 34 receives this time varying electrical signal and uses a switching demodulation technique to produce a voltage magnitude control signal on line 36 and a frequency control signal on line 38. A voltage regulator 40 responds to the voltage magnitude control signal by varying the voltage available to power pole switches 12, while a frequency control 42 responds to the frequency control signal through microprocessor controller 10 to vary the frequency of the waveform patterns on lines A, B and C. To perform the switching demodulation function, load current demodulator 34 requires a series of input waveforms which are in a specified phase relationship to the Thevenin voltage of phase B of the power system.

For discussion purposes, the preferred embodiment assumes that all system impedances are purely inductive. Therefore, microprocessor controller 10 produces a first pulse wave control signal on data line 44 which is in phase with the Thevenin voltage of phase B and designated as $B_0$, and also generates a second pulse wave control signal on data line 46 which lags the Thevenin voltage of phase B by 90° and is designated as $B_{90}$. Inverters 48 and 50 are used to derive a third pulse wave control signal which lags the phase B Thevenin voltage by 180° and is designated as $\overline{B}_0$ on data line 52, and a fourth pulse wave control signal which leads the Thevenin voltage of phase B by 90° and is designated as $\overline{B}_{90}$ on data line 54.

Figure 2:
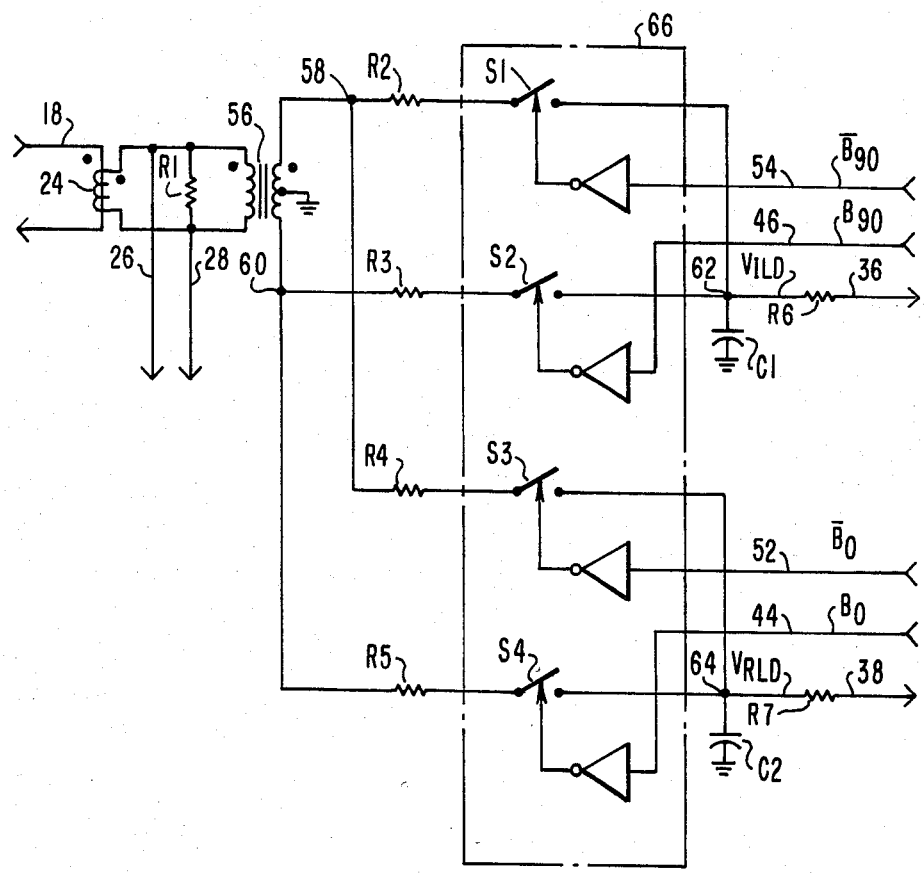
FIG. 2 is a schematic diagram of the demodulator section of the system of FIG. 1.

FIG. 2 is a schematic diagram of load current demodulator 34 in FIG. 1. Load current division transformer 24 responds to current in phase B conductor 18 and is connected in a series ring with other load current division transformers, such as transformer 24' in FIG. 1, in phase B of each channel by way of lines 26 and 28. Resistor R1 is connected across load current transformer 24 such that the series connection of all load current transformers results in the generation of a time varying electrical signal across resistor R1 which represents load current unbalance in the respective channel. This time varying electrical signal is transmitted to transformer 56 which has a grounded center tapped secondary such that a pair of time varying electrical signals appear at terminals 58 and 60, which are 180° out of phase with respect to each other. Terminal 58 is coupled to an output terminal 62 through resistor R2 and switch S1, while being coupled to output terminal 64 through resistor R4 and switch S3. Terminal 60 is coupled to output terminal 62 through resistor R3 and switch S2, while being coupled to output terminal 64 through resistor R5 and switch S4. Resistors R2 through R5 prevent excessive shoot through currents which could damage the switches if there is an overlap in switch conduction. Switches S1 through S4 are available commercially in a single package 66 such as a Harris HI-201-2 or equivalent. These switches are responsive to the four pulse wave control signals available on data lines 44, 46, 52 and 54 which were derived from the microprocessor controller 10 of FIG. 1. Through the operation of switches S1 through S4 in response to the designated pulse wave control signals, the voltage appearing at terminal 62 is representative of the unbalanced reactive current component and the voltage appearing at terminal 64 is representative of the unbalanced real current component. These voltages are then transmitted through resistors R6 and R7 onto data lines 36 and 38 to control the voltage magnitude and the frequency of the output of the phase B inverter. Optional capacitors C1 and C2 are used to smooth the terminal voltages if required.

Figure 3:
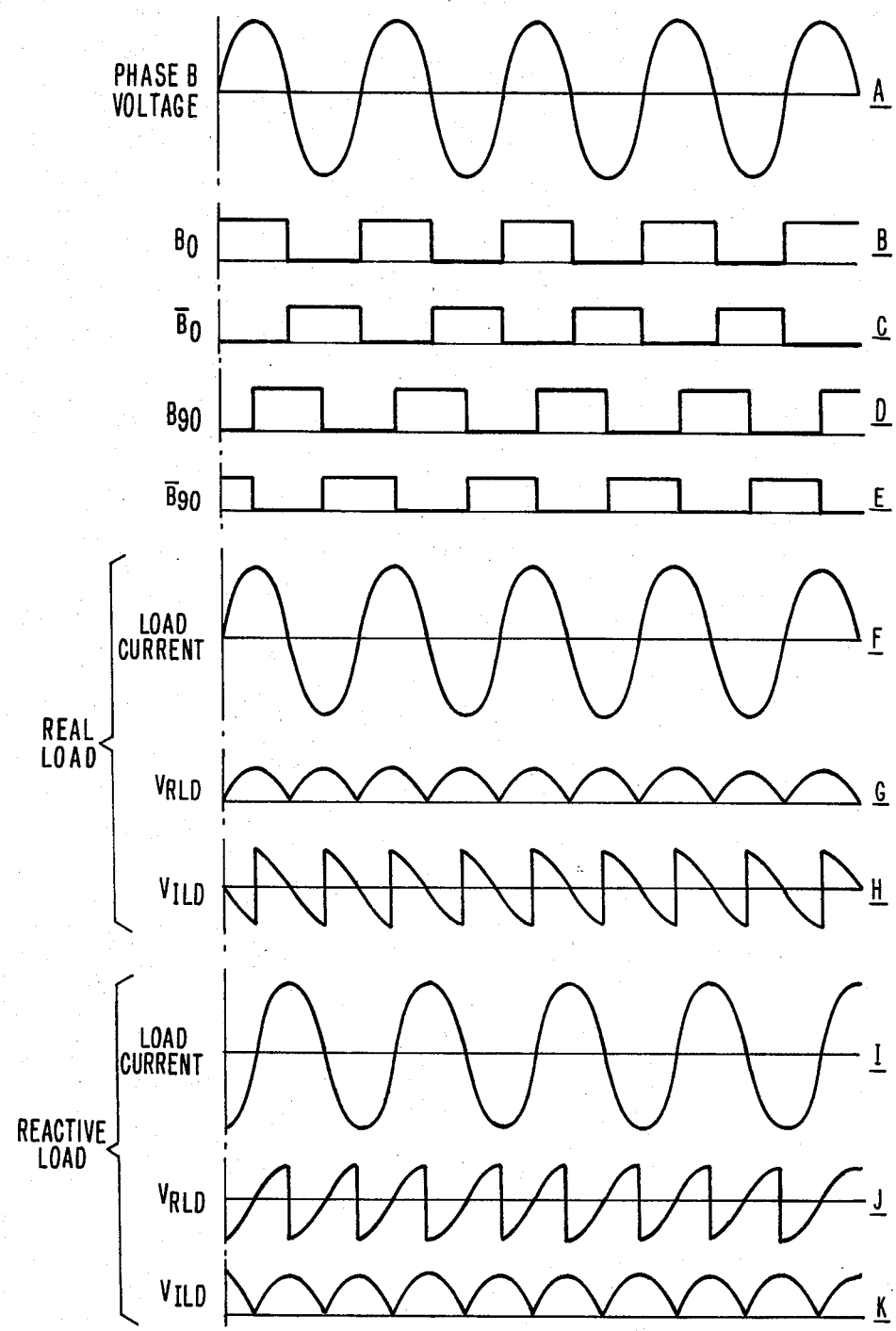
FIG. 3 is a series of waveforms illustrating the voltages present at various points in the power system of FIG. 1.

In order to further illustrate the operation of this invention, FIG. 3 is a series of waveforms illustrating voltages and currents, for a system having purely inductive impedances, which appear at selected points in the circuit of FIGS. 1 and 2 with capacitors C1 and C2 removed for clarity. Waveform A of FIG. 3 is the Thevenin voltage of phase B. The pulse wave control signals $B_0$, $\overline{B}_0$, $B_{90}$ and $\overline{B}_{90}$ are respectively shown as waveforms B, C, D and E of FIG. 3. By extending these pulse wave control signals, it is apparent that $B_0$ is in phase with the Thevenin voltage of phase B while $\overline{B}_0$ is 180° out of phase with $B_0$. $B_{90}$ is seen to be lagging the Thevenin voltage of phase B by 90° while $\overline{B}_{90}$ leads the Thevenin voltage of phase B by 90°. If the real load current in the system is as shown in waveform F of FIG. 3, then the voltage $V_{RLD}$ appearing at terminal 64 in FIG. 2 will be as shown in waveform G of FIG. 3, and the voltage $V_{ILD}$ appearing at terminal 62 in FIG. 2 will be as shown in waveform H of FIG. 3. For a reactive load current as shown in waveform I of FIG. 3, the voltage $V_{RLD}$ appearing at terminal 64 in FIG. 2 will be as shown in waveform J of FIG. 3, and voltage $V_{ILD}$ appearing at terminal 62 in FIG. 2 will be as shown in waveform K of FIG. 3. By examining the waveforms of FIG. 3, it will be apparent to those skilled in the art that the average voltage $V_{RLD}$ will be positive for a real load current and zero for a reactive load current, while voltage $V_{ILD}$ will average zero for a real load current and a positive value for a reactive load current.

It should be understood that the phase angles of the pulse wave control signals illustrated in FIG. 3 were selected for illustration purposes to be applicable to a power system wherein the power source Thevenin impedances and the bus impedances are purely inductive. In an actual system, the Thevenin impedance of the generators, as well as feeder bus and other parallel impedances will be a mixture of resistive and reactive components. The phase angles of the pulse wave control signals should be adjusted to approximately match the actual system impedances. Any error in this adjustment will manifest itself as an interaction between real and reactive controls. This is found, to some degree, in any physically realizable system. The effects are not harmful to system control. For example, in an actual system, the phase angle of $B_0$ may be $-10°$ while the phase angle of $B_{90}$ is $80°$. In any case, the difference of $90°$ remains. The proper phase angles can be easily provided in inverter or converter systems. If conventional generators are used, the required signals can be approximately derived from the terminal voltage by capacitor/resistor networks.

Although four pulse wave control signals are shown in the described embodiment, a system can be constructed in accordance with this invention which utilizes only two pulse wave control signals wherein one of the signals is in phase with the Thevenin voltage of phase B and the other of the control signals is $90°$ out of phase with the Thevenin voltage of phase B. Therefore for an embodiment utilizing two control signals, the present invention encompasses a method for demodulating a time varying electrical signal comprising the steps of: generating a first pulse wave control signal which is in phase with the real component of the signal being demodulated; switching the signal being demodulated to a first output terminal when the first pulse wave control signal is at a predetermined voltage level; generating a second pulse wave control signal which is phase displaced from said first pulse wave control signal by $90°$; and switching the signal being demodulated to a second output terminal when the second pulse wave control signal is at a second predetermined voltage level. It should be apparent that additional pulse wave control signals and switching elements can be added in accordance with this invention as described in this description of the preferred embodiment. A parallel source power system constructed in accordance with this invention is controlled by a method comprising the steps of: generating a time varying electrical signal proportional to unbalanced current flow from one power source in the power system; generating a first pulse wave control signal which is in phase with the real component of the time varying electrical signal; switching the time varying electrical signal to a first terminal when the first pulse wave control signal is at a predetermined voltage level; generating a second pulse wave control signal which is phase displaced from said first pulse wave control signal by $90°$; switching the time varying electrical signal to a second terminal when the second pulse wave control signal is at a predetermined voltage level; controlling the frequency of the power source in response to the voltage on the first terminal; and controlling the voltage magnitude of the power source in response to the voltage on the second terminal. It should be understood that additional pulse wave control signals can be utilized as shown in the foregoing preferred embodiment description. Alternatively, a second time varying electrical signal which is $180°$ out of phase with the first time varying electrical signal can be used, wherein the second time varying electrical signal is switched to the same output terminals with the switching being $180°$ out of phase with the switching of the first time varying electrical signal.

While what has been described is at present believed to be the preferred embodiment of this invention, it will be apparent to those skilled in the art that various changes and modifications may be made to the preferred embodiment without departing from the scope of this invention. For example, the pulse wave control signals need not be square waves as illustrated, but must only meet the phase requirements described. It is therefore intended that the appended claims cover all such changes or modifications thaat fall within the scope of this invention.

What is claimed is:

1. A demodulator circuit comprising:
    a first input terminal for receiving a first time varying electrical signal whose waveform is subject to variation;
    a second input terminal for receiving a first pulse wave control signal;
    means for switching said first time varying signal to a first output terminal when said first pulse wave control signal is at a first predetermined voltage level, thereby producing a voltage on said first output terminal which is representative of the real component of said first time varying signal;
    a third input terminal for receiving a second pulse wave control signal being phase displaced from said first pulse wave control signal by $90°$; and
    means for switching said first time varying signal to a second output terminal when said second pulse wave control signal is at a second predetermined voltage level, thereby producing a voltage on said second output terminal which is representative of the reactive component of said first time varying signal.

2. A demodulator as recited in claim 1, wherein said first and second pulse wave control signals are square waves.

3. A demodulator as recited in claim 1, wherein said means for switching said first time varying signal to said first and second output terminals comprises at least two analog switches.

4. A demodulator circuit as recited in claim 1, further comprising:
    a fourth input terminal for receiving a second time varying electrical signal which is equivalent to said first time varying electrical signal that has been displaced by $180°$;
    means for switching said second time varying signal to said first output terminal when said first pulse wave control signal is at a third predetermined voltage level; and
    means for switching said second time varying signal to said second output terminal when said second pulse wave control signal is at a fourth predetermined voltage level.

5. A demodulator circuit as recited in claim 4, further comprising:
    a transformer having a center tapped secondary, wherein said first time varying electrical signal is derived from one half of said secondary and said second time varying electrical signal is derived from the other half of said secondary.

6. A demodulator circuit as recited in claim 4, wherein said first and second pulse wave control signals are square waves.

7. A demodulator circuit as recited in claim 4, wherein said means for switching said first time varying signal to said first and second output terminals and said means for switching said second time varying signal to said first and second output terminals each comprise an analog switch.

8. A demodulator circuit as recited in claim 1, further comprising:
- a fourth input terminal for receiving a second time varying electrical signal which is equivalent to said first time varying electrical signal that has been phase displaced by 180°;
- a fifth input terminal for receiving a third pulse wave control signal being phase displaced from said first pulse wave control signal by 180°;
- means for switching said second time varying signal to said first output terminal when said third pulse wave control signal is at a third predetermined voltage level;
- a sixth input terminal for receiving a fourth pulse wave control signal being phase displaced from said second pulse wave control signal by 180°; and
- means for switching said second time varying signal to said second output terminal when said fourth pulse wave control signal is at a fourth predetermined voltage level.

9. A parallel power system, comprising:
- at least two variable voltage, variable frequency power sources having outputs connected to a common bus;
- means for producing a first time varying electrical signal whose waveform is subject to variation in response to unbalanced current flowing out of said power sources;
- means for producing a first pulse wave control signal in phase with the Thevenin voltage of a first one of said power sources;
- means for switching said first time varying electrical signal to a first terminal when said first pulse wave control signal is at a first predetermined voltage level;
- means for controlling the frequency of said first one of said power sources in response to the voltage on said first terminal;
- means for producing a second pulse wave control signal being phase displaced from said first pulse wave control signal by 90°;
- means for switching said first time varying electrical signal to a second terminal when said second pulse wave control signal is at a second predetermined voltage level; and
- means for controlling the magnitude of the voltage of said first one of said power sources in response to the voltage on said second terminal.

10. A parallel power system as recited in claim 9, wherein said first and second pulse wave control signals are square waves.

11. A parallel power system as recited in claim 9, wherein said means for switching said first time varying signal to said first and second terminals each comprise an analog switch.

12. A parallel power system as recited in claim 9, further comprising:
a capacitor connected to said second terminal.

13. A parallel power system as recited in claim 9, further comprising:
- means for producing a second time varying electrical signal which is equivalent to said first time varying electrical signal that has been displaced by 180°;
- means for switching said second time varying signal to said first terminal when said first pulse wave control signal is at a third predetermined voltage level; and
- means for switching said second time varying signal to said second terminal when said second pulse wave control signal is at a fourth predetermined voltage level.

14. A parallel power system as recited in claim 13, further comprising:
a transformer having a center tapped secondary, wherein said first time varying electrical signal is derived from one half of said secondary and said second time varying electrical signal is derived from the other half of said secondary.

15. A parallel power system as recited in claim 13, wherein said first and second pulse wave control signals are square waves.

16. A parallel power system as recited in claim 13, wherein said means for switching said first time varying signal to said first and second terminals and said means for switching said second time varying signal to said first and second terminals each comprise at least two analog switches.

17. A parallel power system as recited in claim 9, further comprising:
- means for producing a second time varying electrical signal which is equivalent to said first time varying electrical signal that has been displaced by 180°;
- means for producing a third pulse wave control signal being phase displaced from said first pulse wave control signal by 180°;
- means for switching said second time varying signal to said first terminal when said third pulse wave control signal is at a third predetermined voltage level;
- means for producing a fourth pulse wave control signal being phase displaced from said second pulse wave control signal by 180°; and
- means for switching said second time varying signal to said second terminal when said fourth pulse wave control signal is at a fourth predetermined voltage level.

18. A method for demodulating a time varying electrical signal whose waveform is subject to variation, comprising the steps of:
- generating a first pulse wave control signal which is in phase with the real component of the signal being demodulated;
- switching the signal being demodulated to a first output terminal when said first pulse wave control signal is at a first predetermined voltage level;
- generating a second pulse wave control signal which is phase displaced from said first pulse wave control signal by 90°; and
- switching the signal being demodulated to a second output terminal when said second pulse wave control signal is at a second predetermined voltage level.

19. A method for demodulating a time varying electrical signal whose waveform is subject to variation, comprising the steps of:

developing a first and second phase displaced signals having zero and 180° phase displacements respectively from the signal being demodulated;

generating a first pulse wave control signal which is in phase with the real component of the signal being demodulated;

switching the first of said phase displaced signals to a first output terminal when said first pulse wave control signal is at a first predetermined voltage level;

switching the second of said phase displaced signals to said first output terminal when said first pulse wave control signal is at a second predetermined voltage level;

generating a second pulse wave control signal which is phase displaced from said first pulse wave control signal by 90°;

switching the first of said phase displaced signals to a second output terminal when said second pulse wave control signal is at a third predetermined voltage level; and switching the second one of said phase displaced signal to said second output terminal when said second pulse wave control signal is at a fourth predetermined voltage level.

20. A method for controlling a parallel source power system, comprising the steps of:

generating a time varying electrical signal proportional to unbalanced current flow from one power source in the power system being controlled;

generating a first pulse wave control signal which is in phase with the real component of said time varying electrical signal;

switching said time varying electrical signal to a first terminal when said first pulse wave control signal is at a first predetermined voltage level;

generating a second pulse wave control signal which is phase displaced from said first pulse wave control signal by 90°;

switching said time varying electrical signal to a second terminal when said second pulse wave control signal is at a second predetermined voltage level;

controlling the frequency of said power source in response to the voltage on said first terminal; and controlling the voltage magnitude of said power source in response to the voltage on said second terminal.

21. A method for controlling a parallel source power system, comprising the steps of:

generating a time varying electrical signal proportional to unbalanced current flow from one power source in the power system being controlled;

developing a first and second phase displaced signal having zero and 180° phase displacements respectively from said time varying electrical signal;

generating a first pulse wave control signal which is in phase with the real component of said time varying electrical signal;

switching the first of said phase displaced signals to a first terminal when said first pulse wave control signal is at a first predetermined voltage level;

switching the second of said phase displaced signals to said first terminal when said first pulse wave control signal is at a second predetermined voltage level;

generating a second pulse wave control signal which is phase displaced from said first pulse wave control signal by 90°;

switching the first of said phase displaced signals to a second terminal when said second pulse wave control signal is at a third predetermined voltage level;

switching the second of said phase displaced signals to said second terminal when said second pulse wave control signal is at a fourth predetermined voltage level;

controlling the frequency of said power source in response to the voltage on said first terminal; and controlling the voltage magnitude of said power source in response to the voltage on said second terminal.

22. A method for controlling a parallel source power system, comprising the steps of:

generating a time varying electrical signal proportional to unbalanced current flow from one power source;

developing a first and second phase displaced signals having zero and 180° phase displacements respectively from said time varying electrical signal;

generating a first pulse wave control signal which is in phase with the real component of said time varying electrical signal;

switching the first of said phase displaced signals to a first terminal when said first pulse wave control signal is at a first predetermined voltage level;

generating a second pulse wave control signal which is phase displaced from said first pulse wave control signal by 90°;

switching the first of said phase displaced signals to a second terminal when said second pulse wave control signal is at a second predetermined voltage level;

generating a third pulse wave control signal which is phase displaced from said first pulse wave control signal by 180°;

switching the second of said phase displaced signals to said first terminal when said third pulse wave control signal is at a third predetermined voltage level;

generating a fourth pulse wave control signal which is phase displaced from said second pulse wave control signal by 180°;

switching the second of said phase displaced signals to said second terminal when said fourth pulse wave control signal is at a fourth predetermined voltage level;

controlling the frequency of said power source in response to the voltage on said first terminal; and controlling the voltage magnitude of said power source in response to the voltage on said second terminal.

* * * * *